(12) United States Patent
Dore

(10) Patent No.: US 10,473,218 B2
(45) Date of Patent: Nov. 12, 2019

(54) PERIMETER SEAL

(71) Applicant: Delphi Technologies, Inc., Troy, MI (US)

(72) Inventor: Michael Paul Dore, Belleville, MI (US)

(73) Assignee: APTIV TECHNOLOGIES LIMITED (BB)

( * ) Notice: Subject to any disclaimer, the term of this patent is extended or adjusted under 35 U.S.C. 154(b) by 103 days.

(21) Appl. No.: 15/728,056

(22) Filed: Oct. 9, 2017

(65) Prior Publication Data

US 2019/0107199 A1    Apr. 11, 2019

(51) Int. Cl.
| F16J 15/02 | (2006.01) |
| B65D 53/02 | (2006.01) |
| F16J 15/10 | (2006.01) |
| F16J 15/06 | (2006.01) |
| H05K 5/06 | (2006.01) |

(52) U.S. Cl.
CPC .......... *F16J 15/025* (2013.01); *F16J 15/061* (2013.01); *F16J 15/104* (2013.01); *H05K 5/061* (2013.01); *B65D 53/02* (2013.01)

(58) Field of Classification Search
CPC ........ F16J 15/022; F16J 15/025; F16J 15/061; F16J 15/062; F16J 15/104; B65D 53/02
See application file for complete search history.

(56) References Cited

U.S. PATENT DOCUMENTS 2,210,183 A * 8/1940 Schweighart ...... B65D 43/0214
206/557
2,764,311 A    9/1956 Blackman
(Continued)

FOREIGN PATENT DOCUMENTS

DE    10 2006 006386 A1    8/2007
JP    2008 267542 A    11/2008
(Continued)

OTHER PUBLICATIONS

European Search Report for Application No. 18198379.2, European Patent Office, dated Feb. 7, 2019.

*Primary Examiner* — Nicholas L Foster
(74) *Attorney, Agent, or Firm* — Robert J. Myers

(57) ABSTRACT

A sealing system includes a first-housing, a second-housing, and a seal. The first-housing defines a mating-surface. The second-housing defines a seal-gland having an inner-wall, a base, and an outer-wall. The second-housing has a perimeter-flange. The seal includes a continuous beam of compliant material compressed within the seal-gland. The seal defines a captured-end disposed within the seal-gland and a free-end extending beyond the second-housing. The seal defines an inner-flange, an outer-flange, a web, and a lip. The lip extends radially outward from and generally perpendicular to the free-end of the outer-flange and is disposed between the perimeter-flange and a portion of the mating-surface. When the second-housing is attached to the first-housing, the inner-flange and the outer-flange forcibly engages the mating-surface of the first-housing, the inner-wall, the base, and the outer-wall of the seal-gland. The lip is compressed between the perimeter-flange and the portion of the mating-surface.

17 Claims, 5 Drawing Sheets

(56) References Cited

U.S. PATENT DOCUMENTS

| | | | | |
|---|---|---|---|---|
| 2,886,205 | A * | 5/1959 | Gerry | A47J 37/105 |
| | | | | 220/378 |
| 3,334,774 | A * | 8/1967 | Poltorak | F16J 15/106 |
| | | | | 220/378 |
| 4,846,482 | A * | 7/1989 | Blodgett | F16J 15/024 |
| | | | | 277/591 |
| 4,934,715 | A * | 6/1990 | Johnson | E02D 29/14 |
| | | | | 220/378 |
| 5,002,290 | A * | 3/1991 | Pernin | F16J 15/024 |
| | | | | 277/649 |
| 6,264,206 | B1 * | 7/2001 | Hashizawa | F16J 15/061 |
| | | | | 277/641 |
| 6,871,962 | B2 * | 3/2005 | Kane | G03B 21/145 |
| | | | | 277/644 |
| 7,648,041 | B2 * | 1/2010 | Ueda | H01L 21/67126 |
| | | | | 206/710 |
| 7,815,198 | B2 * | 10/2010 | Tani | F02F 11/002 |
| | | | | 277/630 |
| 7,938,406 | B2 * | 5/2011 | Matsumoto | F02F 11/007 |
| | | | | 277/596 |
| 8,136,819 | B2 * | 3/2012 | Yoshitsune | F16J 15/025 |
| | | | | 277/630 |
| 8,333,386 | B2 * | 12/2012 | Takeda | F16L 23/22 |
| | | | | 277/608 |
| 9,027,936 | B2 * | 5/2015 | Yoshitsune | F16J 15/061 |
| | | | | 277/591 |
| 9,169,874 | B2 * | 10/2015 | Willaczek | F16C 33/76 |
| 9,426,912 | B2 * | 8/2016 | Miki | F16J 15/025 |
| 9,887,116 | B2 * | 2/2018 | Ozawa | H01L 21/67369 |
| 10,175,636 | B2 * | 1/2019 | Yoshitsugu | G03G 15/6502 |
| 2004/0173976 | A1 * | 9/2004 | Boggs | F16J 15/164 |
| | | | | 277/628 |
| 2006/0081635 | A1 * | 4/2006 | Matsutori | F16J 15/025 |
| | | | | 220/378 |
| 2006/0290075 | A1 * | 12/2006 | Tani | F02F 11/002 |
| | | | | 277/628 |
| 2010/0102519 | A1 * | 4/2010 | Yoshitsune | F16J 15/025 |
| | | | | 277/641 |
| 2010/0320699 | A1 * | 12/2010 | Takeda | F16L 23/22 |
| | | | | 277/612 |
| 2015/0108711 | A1 * | 4/2015 | Ryuzaki | G03G 15/6502 |
| | | | | 271/162 |
| 2017/0248900 | A1 * | 8/2017 | Yoshitsugu | G03G 15/6502 |

FOREIGN PATENT DOCUMENTS

| | | |
|---|---|---|
| WO | 96/18836 A1 | 6/1996 |
| WO | 2013/155091 A1 | 10/2013 |

\* cited by examiner

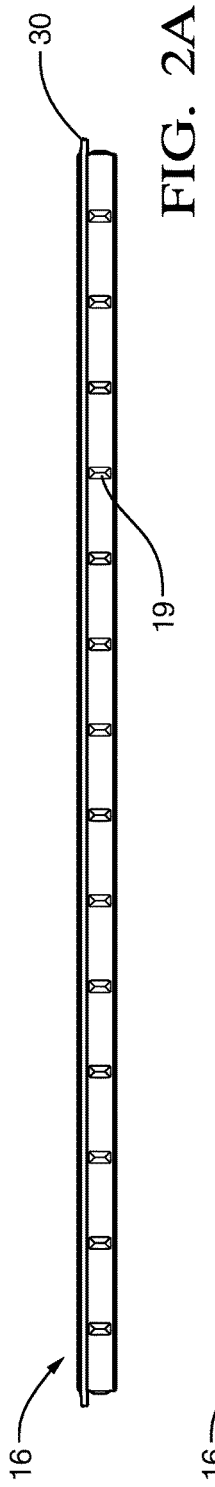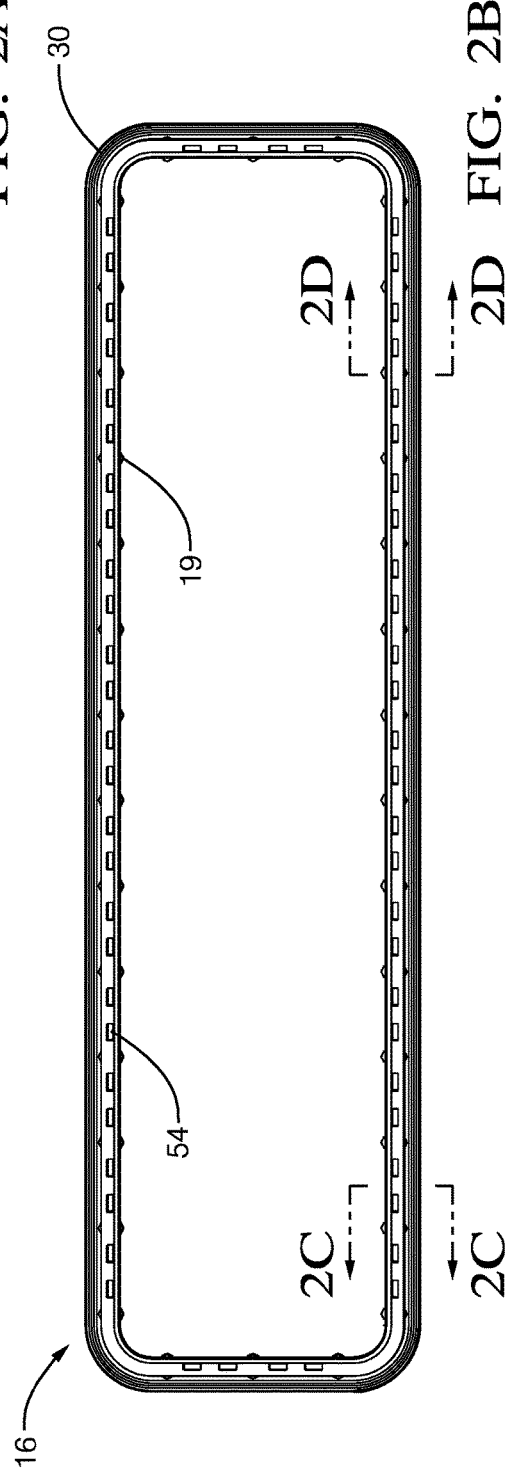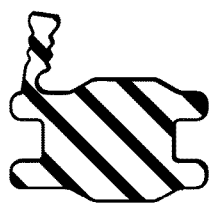

PERIMETER SEAL

TECHNICAL FIELD OF INVENTION

This disclosure generally relates to a retained perimeter seal for electronic packages, and more particularly relates to a retained perimeter seal that is exposed to moisture.

BACKGROUND OF INVENTION

It is known to use a retained perimeter seal for sealing electronic packages against moisture intrusion. The typical perimeter seal is retained in a groove disposed within a flange of a housing and seals against an enclosure that attaches to the housing. The enclosure may create a crevice at an interface between the enclosure and the flange of the housing away from the perimeter seal that may be exposed to moisture. The moisture may wick between exposed mating surfaces of flanges and corrode the housing within the crevice (i.e. crevice corrosion). Once a migration path between the flanges is established, the moisture may also wick around the retained seal and corrode the internal electronic components within the housing.

The subject matter discussed in the background section should not be assumed to be prior art merely as a result of its mention in the background section. Similarly, a problem mentioned in the background section or associated with the subject matter of the background section should not be assumed to have been previously recognized in the prior art. The subject matter in the background section merely represents different approaches, which in and of themselves may also be inventions.

SUMMARY OF THE INVENTION

Described herein is a retained perimeter seal that is configured to inhibit crevice corrosion that may occur between two mating flanges of a housing when exposed to moisture.

In accordance with one embodiment, a sealing system is provided. The sealing system includes a first-housing, a second-housing, and a seal. The first-housing defines a mating-surface. The second-housing defines a seal-gland having an inner-wall, a base, and an outer-wall. The second-housing has a perimeter-flange extending perpendicular to the outer-wall of the seal-gland and overlying a portion of the mating-surface. The seal includes a continuous beam of compliant material compressed within the seal-gland. The beam is characterized as having generally an H-shaped cross-section. The seal defines a captured-end disposed within the seal-gland and a free-end extending beyond the second-housing. The seal defines an inner-flange, an outer-flange, a web disposed between the inner-flange and the outer-flange, and a lip. The lip extends radially outward from and generally perpendicular to the free-end of the outer-flange and is disposed between the perimeter-flange and a portion of the mating-surface. When the second-housing is attached to the first-housing, the inner-flange and the outer-flange forcibly engages the mating-surface of the first-housing, the inner-wall, the base, and the outer-wall of the seal-gland. The lip is compressed between the perimeter-flange and the portion of the mating-surface overlaid by the perimeter-flange.

The web defines a plurality of voids disposed in a top-surface of the web and in a bottom-surface of the web. The plurality of voids are configured to reduce in volume when the seal is compressed. The lip defines an angle relative to the outer-flange in a range from 75 degrees to 135 degrees. A cross-section of the lip is reduced in thickness at a proximal-end of the lip relative to a mid-section of the lip. The cross-section of the lip is increased in thickness at a distal-end of the lip relative to the mid-section of the lip. The distal-end of the lip is compressed in a range from about 1% to about 55%. The beam is compressed in a range from about 20% to about 35%.

The seal-gland has a gland-fill from about 80% to about 95% when the first-housing is attached to the mating-surface and the seal is compressed. The seal is formed of a silicone-based material.

In another embodiment, a seal is provided. The seal includes a continuous beam of compliant material configured to be compressed within a seal-gland of a first-housing. The beam is characterized as having generally an H-shaped cross-section. The seal defines a captured-end for disposal within the seal-gland and a free-end that extends beyond the first-housing. The seal defines an inner-flange, an outer-flange, a web disposed between the inner-flange and the outer-flange, and a lip. The lip extends radially outward from and generally perpendicular to the free-end of the outer-flange. The lip is configured to be compressed between the first-housing and a mating-surface of a second-housing.

The web defines a plurality of voids in a top-surface of the web and in a bottom-surface of the web. The plurality of voids are configured to reduce in volume when the seal is compressed. The lip defines an angle relative to the outer-flange in a range from 75 degrees to 135 degrees. A cross-section of the lip is reduced in thickness at a proximal-end of the lip relative to a mid-section of the lip. The cross-section of the lip is increased in thickness at a distal-end of the lip relative to the mid-section of the lip. The distal-end is compressed in a range from about 1% to about 55%. The continuous beam is compressed in a range from about 20% to about 35%.

The seal-gland has a gland-fill from about 80% to about 95% when the first-housing is attached to the mating-surface and the seal is compressed. The seal is formed of a silicone-based material.

In yet another embodiment, a sealing system is provided. The sealing system includes a first-housing, a second-housing, and a continuous seal. The continuous seal is formed of compliant material compressed between the first-housing and the second-housing. The continuous seal has generally an H-shaped cross-section and defines a lip extending radially outward from the continuous seal configured to inhibit a liquid-intrusion between the first-housing and the second-housing.

Further features and advantages will appear more clearly on a reading of the following detailed description of the preferred embodiment, which is given by way of non-limiting example only and with reference to the accompanying drawings.

BRIEF DESCRIPTION OF DRAWINGS

The present invention will now be described, by way of example with reference to the accompanying drawings, in which:

FIG. 2A is an illustration of a side view of a seal of the sealing system of FIG. 1 in accordance with one embodiment;

FIG. 2B is an illustration of a top view of the seal of the sealing system of FIG. 1 in accordance with one embodiment;

FIG. 2C is an illustration of a cross section view of the seal of FIG. 2A in accordance with one embodiment;

FIG. 2D is an illustration of another cross section view of the seal of FIG. 2A in accordance with one embodiment;

DETAILED DESCRIPTION

Figure 1:
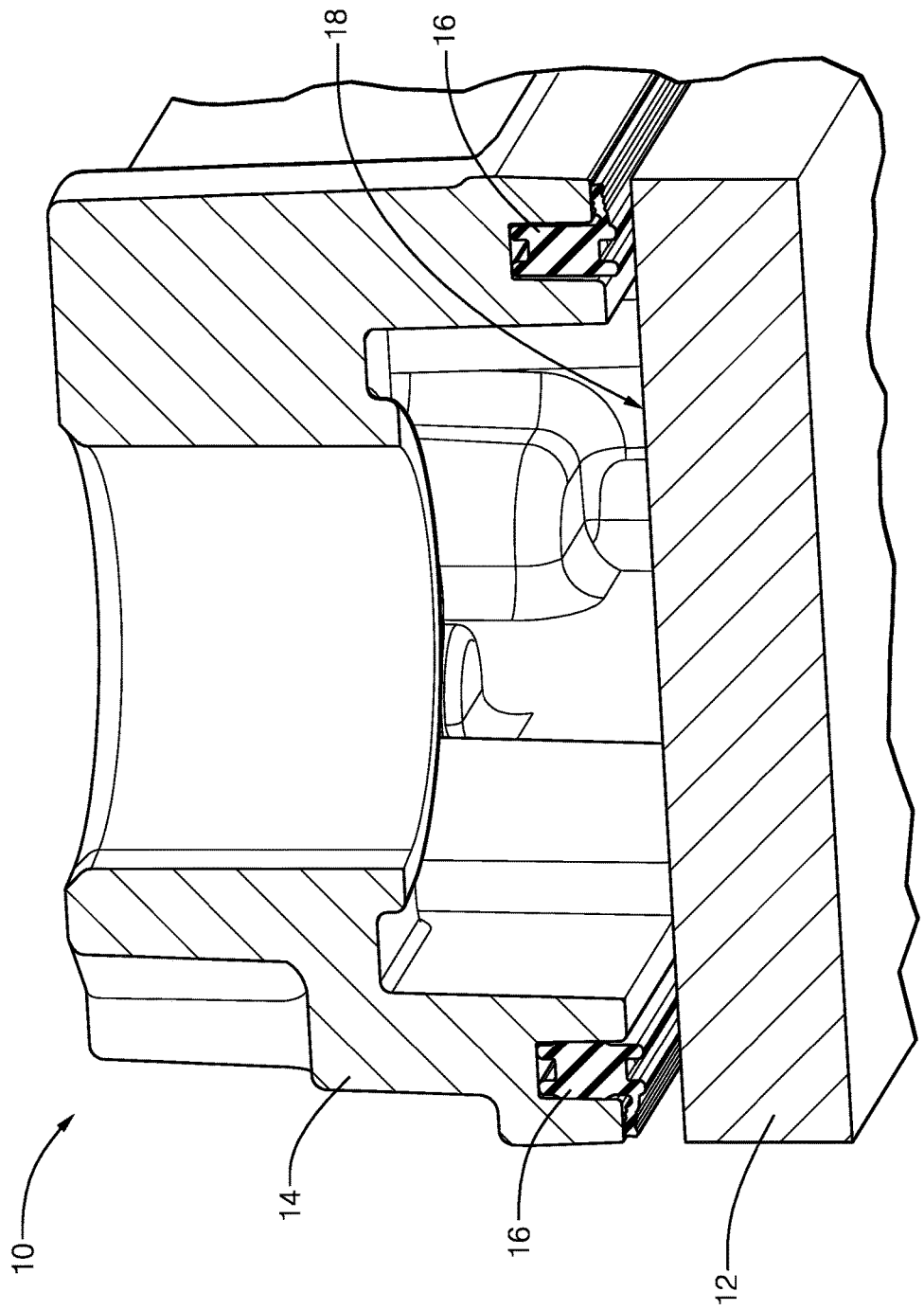
FIG. 1 is an illustration of a cross section view of a sealing system in accordance with one embodiment.

FIG. 1 illustrates a section-view of non-limiting example of a sealing system 10. The sealing system 10 includes a first-housing 12, a second-housing 14, and a seal 16. The first-housing 12 defines a mating-surface 18 that is configured to be attached to the second-housing 14 with fasteners (not shown). The fasteners may be threaded bolts that pass through the first-housing 12 and engage threaded holes machined into the second-housing 14. The mating-surface 18 is configured to engage the seal 16 and a portion of the second-housing 14, as will be explained in further detail below.

FIGS. 2A-2D illustrate a non-limiting example of the seal 16 isolated from the sealing system 10. The seal 16 is illustrated as a continuous loop of material in FIG. 2B. The seal 16 may include retention bumps 19 that create an interference fit between the seal 16 and the second-housing 14. FIG. 2D illustrates the cross section of the seal 16 in the area of the retention bump 19 that is characterized has having a wider cross section than the area of the seal 16 without the retention bump 19 in FIG. 2C.

Figure 3:
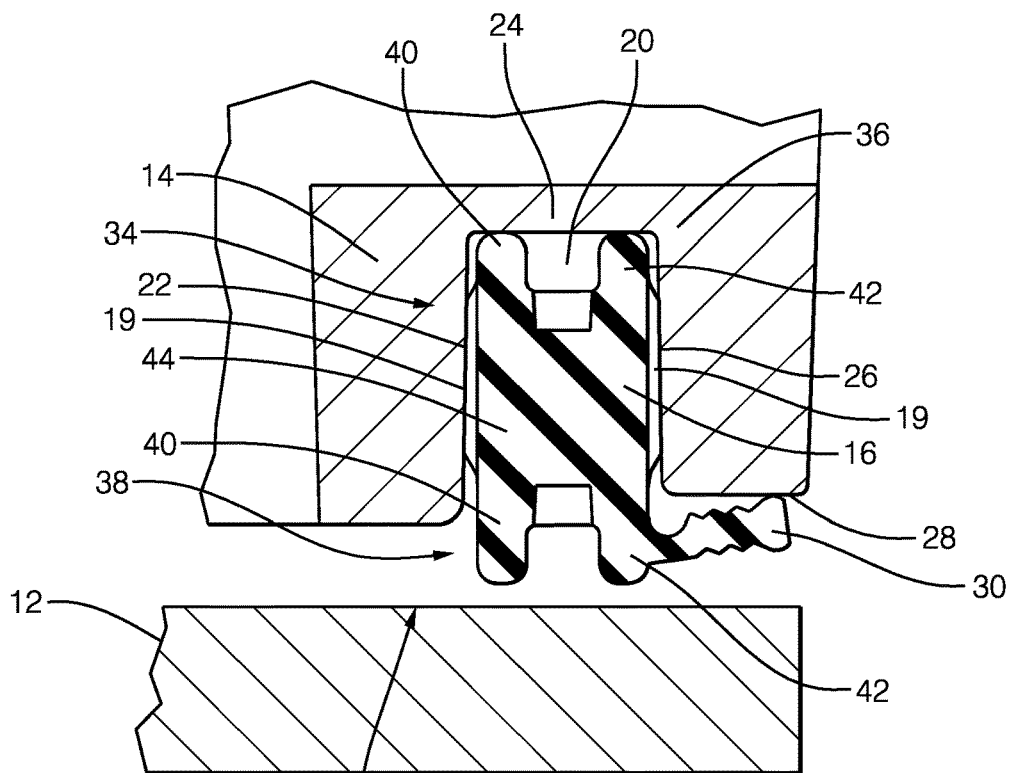
FIG. 3 is an illustration of a cross section view of the sealing system of FIG. 1 in accordance with one embodiment.

FIG. 3 is an enlarged view of the sealing system 10 of FIG. 1. The second-housing 14 defines a seal-gland 20 that has an inner-wall 22, a base 24, and an outer-wall 26. The seal-gland 20 (a cavity bounded by the inner-wall 22, the base 24, and the outer-wall 26) is configured to retain the seal 16 until the second-housing 14 is attached to the first-housing 12. The second-housing 14 has a perimeter-flange 28 extending perpendicular to the outer-wall 26 of the seal-gland 20 and overlying a portion of the mating-surface 18. A gap exists between the perimeter-flange 28 and the mating-surface 18, when the first-housing 12 is attached to the second-housing 14, to accommodate a lip 30 of the seal 16, as will be explained in more detail below.

The seal 16 includes a continuous beam 32 of compliant material compressed within the seal-gland 20 and is characterized as having generally an H-shaped cross-section 34. The seal 16 may be formed of polymeric material, such as a silicone-based material. The seal 16 defines a captured-end 36 disposed within the seal-gland 20 and a free-end 38 that extends beyond the second-housing 14. The seal 16 also defines an inner-flange 40, an outer-flange 42, a web 44 disposed between the inner-flange 40 and the outer-flange 42, and the lip 30. The lip 30 extends radially outward from, and generally perpendicular to, the free-end 38 of the outer-flange 42 and is disposed between the perimeter-flange 28 and a portion of the mating-surface 18. That is, the lip 30 is configured to fill the gap that exists between the perimeter-flange 28 and the mating-surface 18 when the first-housing 12 is attached to the second-housing 14 and the seal 16 is compressed.

Figure 4:
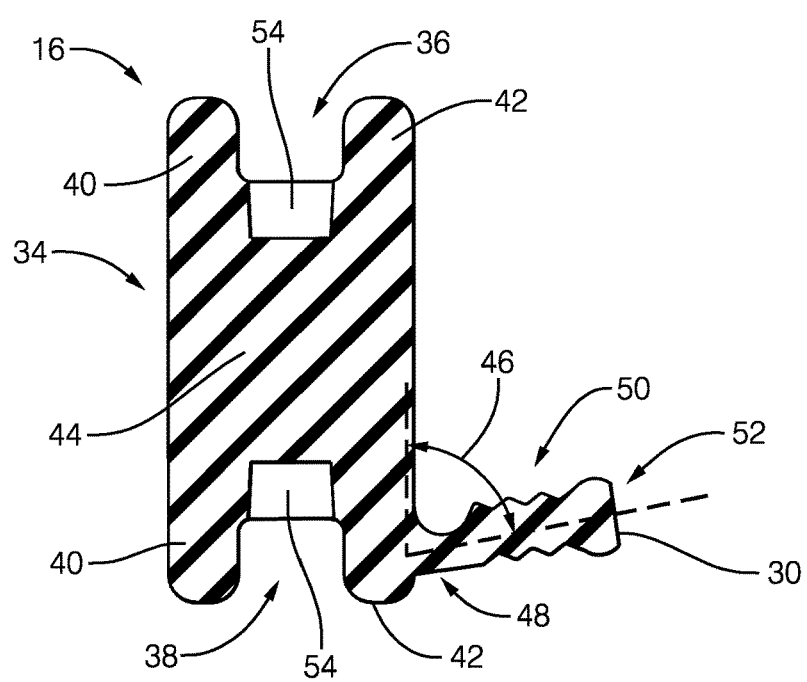
FIG. 4 is an enlarged view of FIG. 2C illustrating the cross section of the seal in accordance with one embodiment.

FIG. 4 illustrates the cross-section of the seal 16 of FIG. 2C in the area without the retention bump 19. The lip 30 may define an angle 46 relative to the outer-flange 42 in a range from 75 degrees to 135 degrees. Preferably, the angle 46 is 82 degrees. The angle 46 is beneficial because the angle 46 may enable the outer-flange 42 to maintain an alignment with the mating-surface 18 during compression. The cross-section of the lip 30 is reduced in thickness at a proximal-end 48 of the lip 30 relative to a mid-section 50 of the lip 30. That is, the portion of the lip 30 closest to the outer-flange 42 is undercut to reduce strain that is induced in the lip 30 during compression. Analysis by the inventor has discovered that the undercut reduces the principal strain in the proximal-end 48 of the lip 30 by greater than 30%. Conversely, the cross-section of the lip 30 is increased in thickness at a distal-end 52 of the lip 30 relative to the mid-section 50. The increase in the cross-section at the distal-end 52 inhibits liquid-intrusion between the first-housing 12 and the second-housing 14 by increasing the compressive force on the lip 30 within the gap. The distal-end 52 of the lip 30 may not be fully constrained during the compression of the seal 16 and may expand radially outward into the gap, which helps reduce the principal strain induced in the distal-end 52 of the lip 30.

Figure 5B:
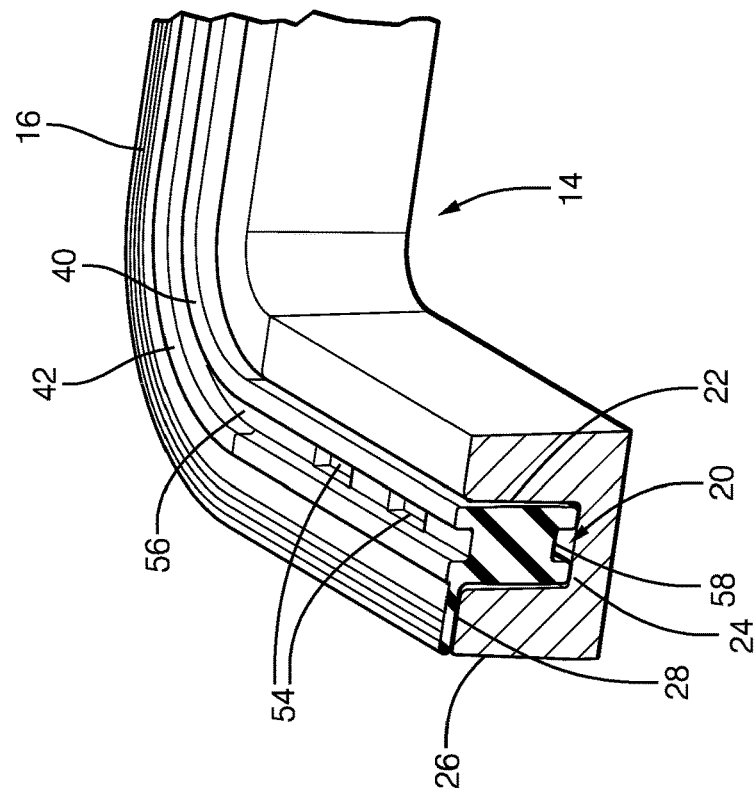
FIG. 5B is an illustration of the seal of FIG. 2B in a compressed state in accordance with one embodiment.
Figure 5A:
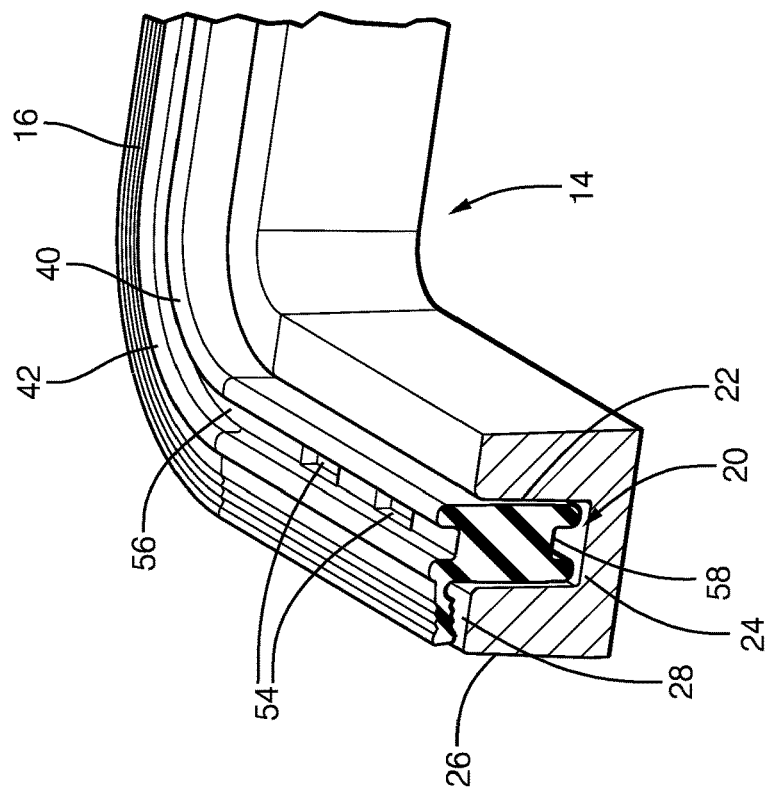
FIG. 5A is an illustration of the seal of FIG. 2B in an uncompressed state in accordance with one embodiment.

FIGS. 5A-5B illustrate the seal 16 retained in the seal-gland 20 of the second-housing 14 in the uncompressed and compressed states, respectively. The mating-surface 18 is removed to more clearly show the deformation of the seal 16 during compression. When the second-housing 14 is attached to the first-housing 12 and the seal 16 is compressed, the inner-flange 40 and the outer-flange 42 forcibly engage the mating-surface 18 of the first-housing 12, the inner-wall 22, the base 24, and the outer-wall 26 of the seal-gland 20. The lip 30 is compressed between the perimeter-flange 28 and the portion of the mating-surface 18 that is overlaid by the perimeter-flange 28. The continuous beam 32 may be compressed in a range from about 20% to about 35%, and may result in the seal-gland 20 having a gland-fill from about 80% to about 95% when the seal 16 is compressed. The distal-end 52 of the lip 30 may be compressed in a range from about 1% to about 55% of its original thickness, based on a flatness of the perimeter-flange 28 and the mating-surface 18.

The web 44 may define a plurality of voids 54 disposed in a top-surface 56 of the web 44 and in a bottom-surface 58 of the web 44. The plurality of voids 54 are configured to reduce in volume when the seal 16 is compressed. That is, the seal 16 material surrounding the voids 54 expands into voids 54 when the seal 16 is compressed and reduces the volume of the voids 54. In the non-limiting example of the seal 16 illustrated in FIG. 2B, the plurality of voids 54 results in a 2.8% reduction in the total material used in the seal 16 compared to the seal 16 without the plurality of voids 54. Analysis by the inventor has discovered that the addition of the plurality of voids 54 is beneficial in reducing the principal strain within the web 44 of the seal 16.

Figure 6:
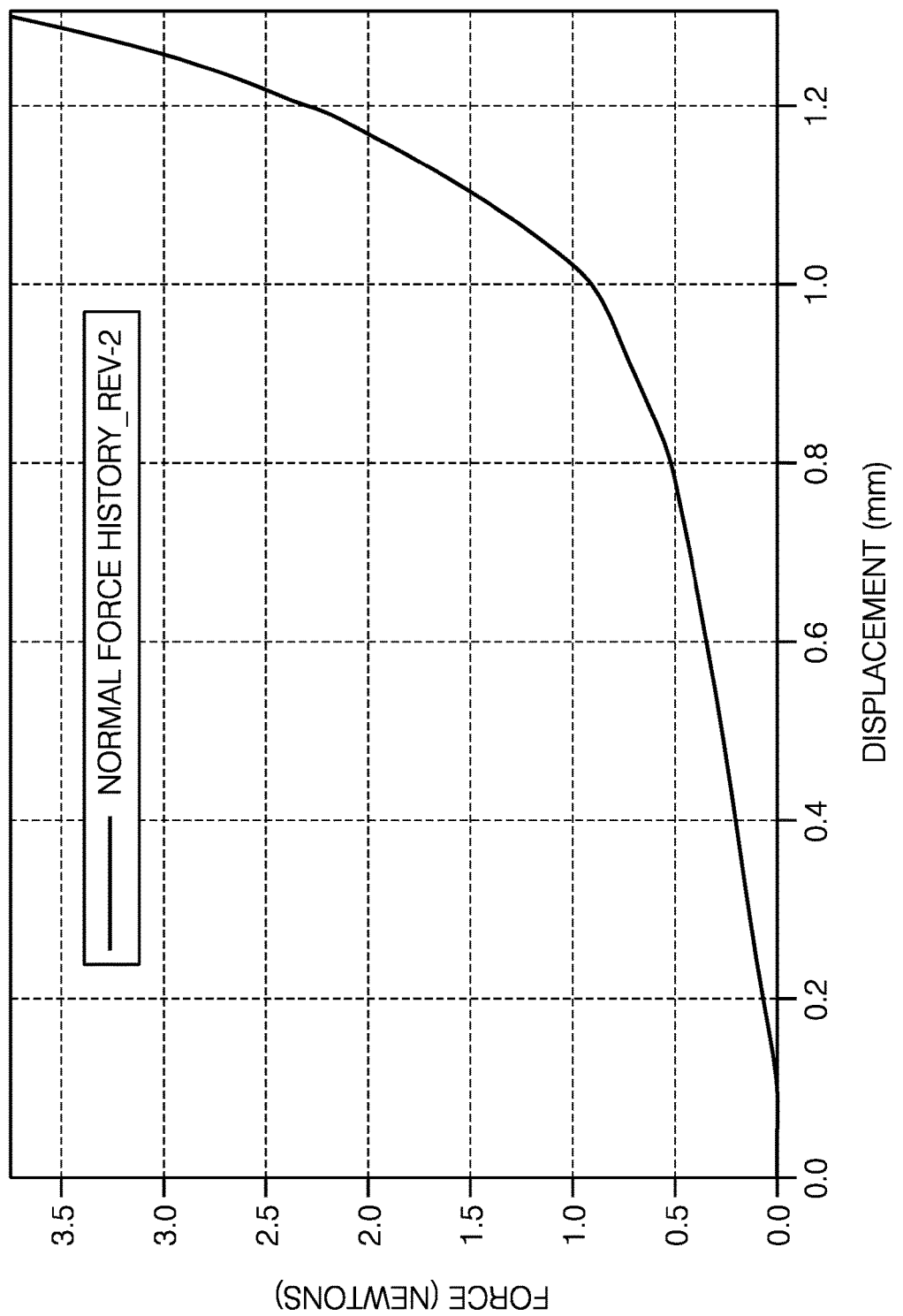
FIG. 6 is a plot of force versus displacement of the seal of FIGS. 5A-5B in accordance with one embodiment.

FIG. 6 illustrates a graph of a force applied to the seal 16 versus a displacement of the seal 16 when the seal 16 is compressed. The origin of the graph is represented in FIG. 5A, where zero applied force results in zero displacement of the seal 16. The end-point of a line of the graph represents the force applied to compress the seal 16 to the displacement as illustrated in FIG. 5B.

Accordingly, a sealing system 10 is provided. The sealing system 10 is an improvement over other sealing systems because the sealing system 10 includes the lip 30 that inhibits crevice corrosion between the first-housing 12 and the second-housing 14. The seal 16 is also configured to reduce the internal stresses during compression that may improve the durability of the seal 16.

While this invention has been described in terms of the preferred embodiments thereof, it is not intended to be so limited, but rather only to the extent set forth in the claims that follow. Moreover, the use of the terms first, second, etc. does not denote any order of importance, but rather the terms first, second, etc. are used to distinguish one element from another. Furthermore, the use of the terms a, an, etc. do not denote a limitation of quantity, but rather denote the presence of at least one of the referenced items. Additionally, directional terms such as upper, lower, etc. do not denote any particular orientation, but rather the terms upper, lower, etc. are used to distinguish one element from another and locational establish a relationship between the various elements.

I claim:

1. A sealing system, comprising:
a first housing that defines a mating surface;
a second housing that defines a seal gland having an inner wall, a base, and an outer wall, said second housing having a perimeter flange extending perpendicular to the outer wall of the seal gland and overlying a portion of the mating surface; and
a seal that includes a continuous beam of compliant material compressed within the seal gland, said continuous beam characterized as having a generally H-shaped cross-section, said seal defines a captured end disposed within the seal gland and a free end extending beyond the second housing, said seal defines an inner flange, an outer flange, a web disposed therebetween, and a lip, said lip extends radially outward from and generally perpendicular to the free end of the outer flange and is disposed between the perimeter flange and the portion of the mating surface, wherein when the second housing is attached to the first housing the inner flange and the outer flange forcibly engages the mating surface of the first housing, the inner wall, the base, and the outer wall of the seal gland and the lip is compressed between the perimeter flange and the portion of the mating surface;
wherein a cross-section of the lip is increased in thickness at a distal end of the lip relative to a midsection of the lip.

2. The sealing system in accordance with claim 1, wherein the web defines a plurality of voids disposed in a top surface of the web and in a bottom surface of the web, said plurality of voids configured to reduce in volume when the seal is compressed.

3. The sealing system in accordance with claim 1, wherein the lip defines an angle relative to the outer flange in a range from 75 degrees to 135 degrees.

4. The sealing system in accordance with claim 1, wherein the cross-section of the lip is reduced in thickness at a proximal end of the lip relative to a midsection of the lip.

5. The sealing system in accordance with claim 1, wherein the distal end is compressed in a range from about 1% to about 55%.

6. The sealing system in accordance with claim 1, wherein the continuous beam is compressed in a range from about 20% to about 35%.

7. The sealing system in accordance with claim 1, wherein the seal gland has a gland fill from about 80% to about 95% when the first housing is attached to the mating surface and the seal is compressed.

8. The sealing system in accordance with claim 1, wherein the seal is formed of a silicone-based material.

9. A seal, comprising:
a continuous beam of compliant material configured to be compressed within a seal gland of a first housing, said continuous beam characterized as having a generally H-shaped cross-section, said seal defines a captured end for disposal within the seal gland and a free end configured to extend beyond the first-housing, said seal defines an inner flange, an outer flange, a web disposed therebetween; and
a lip which extends radially outward from and generally perpendicular to the free end of the outer flange, said lip configured to be compressed between the first housing and a mating surface of a second housing;
wherein the a cross-section of the lip is increased in thickness at a distal end of the lip relative to a midsection of the lip.

10. The seal in accordance with claim 9, wherein the web defines a plurality of voids in a top surface of the web and in a bottom surface of the web, said plurality of voids configured to reduce in volume when the seal is compressed.

11. The seal in accordance with claim 9, wherein the lip defines an angle relative to the outer flange in a range from 75 degrees to 135 degrees.

12. The seal in accordance with claim 9, wherein the cross-section of the lip is reduced in thickness at a proximal end of the lip relative to a midsection of the lip.

13. The seal in accordance with claim 9, wherein the distal end is compressed in a range from about 1% to about 55%.

14. The seal in accordance with claim 9, wherein the continuous beam is compressed in a range from about 20% to about 35%.

15. The seal in accordance with claim 9, wherein the seal gland has a gland fill from about 80% to about 95% when the first housing is attached to the mating surface and the seal is compressed.

16. The seal in accordance with claim 9, wherein the seal is formed of a silicone-based material.

17. A sealing system, comprising: a first housing; a second housing, and a continuous seal of compliant material compressed between the first housing and the second housing, said continuous seal having a generally H-shaped cross-section and defining a lip extending radially outward from the continuous seal, the lip configured to inhibit a liquid intrusion between the first housing and the second housing; wherein the lip defines an angle relative to the continuous seal that is about 82 degrees.

* * * * *